(12) United States Patent
Saga et al.

(10) Patent No.: US 8,127,445 B2
(45) Date of Patent: Mar. 6, 2012

(54) METHOD FOR INTEGRATING HEAT TRANSFER MEMBERS, AND AN LED DEVICE

(75) Inventors: Yuji Saga, Utsunomiya (JP); Narumi Une, Tochigi (JP); Yoshinobu Uchida, Tokyo (JP)

(73) Assignee: E. I. Du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/414,770

(22) Filed: Mar. 31, 2009

(65) Prior Publication Data

US 2009/0251864 A1 Oct. 8, 2009

Related U.S. Application Data

(60) Provisional application No. 61/123,054, filed on Apr. 3, 2008.

(51) Int. Cl.
*B21D 53/02* (2006.01)
*H05K 7/20* (2006.01)

(52) U.S. Cl. .......... 29/890.03; 29/890.046; 29/852; 29/830; 29/831; 29/832; 361/704

(58) Field of Classification Search .......... 29/890.46, 29/890.03, 852, 830, 831, 832, 856, 890.046; 313/47, 44, 46; 264/107, 2.2, 2.3, 2.4, 2.5, 264/40.5, 46.5; 361/704
See application file for complete search history.

(56) References Cited

U.S. PATENT DOCUMENTS

| | | | |
|---|---|---|---|
| 4,879,630 A | 11/1989 | Boucard et al. | |
| 5,160,462 A * | 11/1992 | Arahara | 264/1.33 |
| 5,378,516 A * | 1/1995 | Arahara | 428/64.4 |
| 6,211,626 B1 | 4/2001 | Lys et al. | |
| 7,145,179 B2 * | 12/2006 | Petroski | 257/81 |
| 2001/0036065 A1 | 11/2001 | Hirano et al. | |
| 2003/0099799 A1* | 5/2003 | Koike et al. | 428/36.91 |
| 2006/0043401 A1 | 3/2006 | Lee et al. | |
| 2006/0102613 A1* | 5/2006 | Kuibira et al. | 219/444.1 |
| 2006/0180824 A1 | 8/2006 | Kim et al. | |
| 2007/0063321 A1 | 3/2007 | Han et al. | |
| 2007/0070530 A1 | 3/2007 | Seo et al. | |

FOREIGN PATENT DOCUMENTS

EP 1 650 730 4/2006
JP 2005-281467 * 10/2005

* cited by examiner

*Primary Examiner* — Derris Banks
*Assistant Examiner* — Tai Nguyen

(57) ABSTRACT

Disclosed is a method for integrating at least two heat transfer members to provide an integrated composite member, the method comprising:
  a) disposing the at least two heat transfer members in a mold cavity, such that said heat transfer members each have at least one exposed surface forming a surface of a resin injection cavity; and
  b) injecting a thermally conductive resin into the resin injection cavity to contact the exposed surfaces of the at least two heat transfer members, to form the integrated composite member;
wherein the thermally conductive resin has a thermal conductivity of at least 0.7 W/mK or higher.

6 Claims, 3 Drawing Sheets

METHOD FOR INTEGRATING HEAT TRANSFER MEMBERS, AND AN LED DEVICE

The present invention relates to methods for integrating heat transfer members, to provide an integrated composite member using injection molding of thermally conductive resins.

BACKGROUND OF INVENTION

From the viewpoint of high intensity and longer operating life, use of a light emitting diode (LED) as an illumination source is considered. U.S. Pat. No. 6,211,626 disclosed an LED light module comprising a heat transfer member and a LED system and thermal connection including a thermally conductive resin. A light source of a liquid crystal display (LCD) and a light source for illuminating the inside or outside of a room are noted as a specific use application.

JP 2007-109656 discloses an invention that uses an LED as a backlight of a LCD. When using such LED for lighting, an LED array is obtained by combining a plurality of colors such as red, blue and green so as to emit white light. An LED is configured with an LED array disposed on a metal core printed circuit board (MCPCB). Generally a MCPCB is joined to a metallic chassis with a thermal interface material (TIM) such as heat conducting sheet and grease to reduce thermal resistance between the MCPCB and the chassis. An LED emits a large amount of heat. The intensity of the LED decreases if the heat radiated from the periphery of the LED is insufficient. Therefore, various means are used to manage and control heat radiation from LEDs. For example, in a conventional LCD having an LED as a light source, heat is radiated from the LED in the following sequence: LED chip to MCPCB, to thermally conductive grease, to aluminum block, to thermally conductive sheet, to aluminum chassis, to thermally conductive grease, and then to a heat sink. In such a device, joining of members, i.e., joining of the MCPCB to the aluminum chassis and joining of the aluminum chassis to the heat sink, is performed by mechanical means such as screw clamping.

However, joining the members by mechanical means increases the amount of time required for assembly, thereby reducing the mass productivity. Moreover, a thermally conductive sheet or thermally conductive grease is usually expensive, which can weaken the cost competitiveness of the product. What is needed is a method for integrating heat transfer members and LEDs in a manner which circumvents the need for mechanical fabrication of the various members.

SUMMARY OF INVENTION

One aspect of the invention is a method for integrating at least two heat transfer members to provide an integrated composite member, the method comprising:
a) disposing the at least two heat transfer members in a mold cavity, such that said heat transfer members each have at least one exposed surface forming a surface of a resin injection cavity; and
b) injecting a thermally conductive resin into the resin injection cavity to contact the exposed surfaces of the at least two heat transfer members, to form the integrated composite member;
wherein the thermally conductive resin has a thermal conductivity of at least 0.7 W/mK or higher.

Another embodiment is an integrated composite member provided by the various embodiments of the method of the invention.

Another embodiment is an illumination device having a light emitting diode in thermal contact with the integrated composite member provided by the method of various embodiments of the invention

DETAILED DESCRIPTION OF INVENTION

Figure 1:
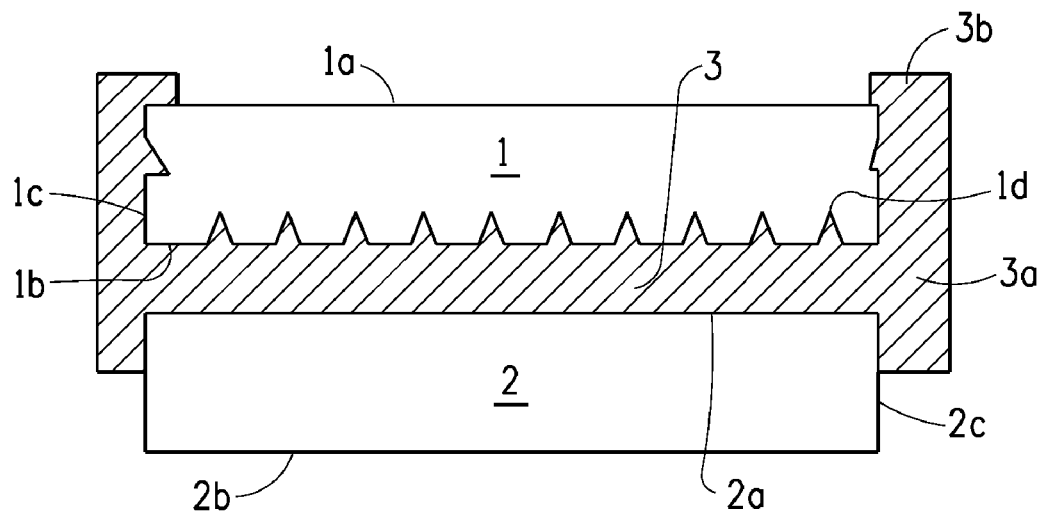
FIGS. 1-4 illustrates an integrated composite members provided by various embodiments of the invention.

The heat transfer members useful in the method of the invention can be any thermally conductive article having dimensions generally compatible with insert injection molding cavities, and having a thermal conductivity of at least 10.0 W/m·K, and more preferably at least 100 W/m·K. Heat transfer members preferably will have softening points or melting points at least 100° C. higher than the highest temperature used in the method. The heat transfer members can be made of metal, thermally conductive composites such as those comprising highly conductive fillers, and carbon composites and sheets. Specific heat transfer members include those selected from the group consisting of MCPCB; metallic pipes, plates, blocks, frames, chassis, and housings; graphite sheets; thermally conductive composite pipes, plate, blocks, frames, chassis, and housings; and any combination thereof.

Heat transfer members useful in the invention include thermally conductive articles that act as heat radiators and/or heat sinks in functioning devices. Heat radiators typically are heat transfer members that have a surface that acts as a heat-receiving surface which receives heat from a heat-emitting source, such as an LED; and a heat-radiating surface which acts to transfer heat to another medium, for instance, outside atmosphere, or the thermally conducting resin, etc. Before assembly into an integrated composite member, whether a surface of a heat transfer member is considered a heat-radiating surface or heat-receiving surface, may not be clear; because the specific function depends upon the relationship of the heat transfer member to the heat-emitting source. Examples of the heat radiators include a thermally conductive chassis, a thermally conductive housing, and a thermally conductive frame; alone, or in combination with a high-surface radiator having a series of fins in order to increase the surface area between the member and the atmosphere or another medium.

When a high-surface radiator is used in the method of the invention, a heat transfer unit, such as a MCPCB or an aluminum block, and the high-surface radiator may be connected to each other using a pipe through which water or oil passes as a heat transfer medium, and the water or oil is circulated to thereby radiate the heat generated from the heat-emitting source, such as an LED. Integration of this circulation pipe with the heat transfer members, and/or integration of the circulation pipe with the radiator can be performed by insert-molding them with the thermally conductive resin.

Heat transfer members useful in the invention that are also heat sinks typically take the form of metal blocks that have the capability to store significant amounts of heat; and radiate that heat over a period of time. Heat sinks have a surface that acts as a heat-receiving surface which receives heat from a heat-emitting source, such as an LED; and a heat-radiating surface which acts to transfer heat to another medium, just as with a radiator. The defining difference between a heat sink and radiator is that heat sinks have a significant the capacity to store heat either as a result of the mass of the material; or as a result of the particular physical attributes of a material included in the heat sink. For instance, in one embodiment the process utilizes a heat transfer member that is a heat sink that includes a thermally conducting medium and a medium capable of undergoing a phase change, for instance, melting, upon absorption of heat.

When a heat transfer member is metallic, the metal used is not particularly limited, and examples of the type of metal include steel, nickel, chrome, copper, zinc, titan, aluminum, magnesium, and any combination thereof. Copper and aluminum are preferred, and aluminum is preferable. An aluminum plate or an aluminum block is especially suitable as a heat transfer member. Preferred metallic frames, chassis, and housings, as heat transfer members, are made of aluminum or magnesium; most preferably aluminum.

When a heat transfer member is a thermally conductive composite, the composite used is not particularly limited, so long as it has the desired thermal conductivity. Examples thereof include ceramic composites, carbon fiber composites, thermally conducting resins having thermal conducting fillers, and any combination thereof.

A specific embodiment is the method wherein at least one heat transfer member is a MCPCB. Another embodiment is a method wherein at least one heat transfer member is a MCPCB upon which is mounted an LED or and LED array. Other embodiments are articles provided by these two specific embodiments.

The method of the invention requires an injection molding cavity adapted to receive at least two or more of the heat transfer members; in such a manner that each heat transfer member, when disposed in the mold cavity, has at least one exposed surface forming a surface of a resin injection cavity. The resin injection cavity is formed when the mold is in the closed position, as is well understood in the art of insert injection molding.

The two or more heat transfer members disposed in the mold cavity can be the same or different. The two or more heat transfer members each have at least one exposed surface forming a surface of a resin injection cavity. The "at least one exposed surface" may have any profile desired by the artisan including a planar surface, angled surface, curved surface, a surface having multiple planes, angles, or curves; or any combination thereof. The term "by at least" is meant that there can be more than one, more than two, more than three, etc., exposed surfaces, within one heat transfer member, and they may be portions of the same surface.

Once the heat transfer members have been inserted into the mold cavity, and the mold closed to form the resin injection cavity, thermally conductive resin is injected into the resin injection cavity to contact the exposed surfaces of at least two heat transfer members, to from the integrated composite member. The thermally conductive resin useful in the invention has a thermal conductivity of at least 0.7 W/m·K, and more preferably, 1 W/mK or higher; as measured by a laser flash method at 23° C. according to Japanese Industrial Standards (JIS) R1611, which is a measurement method using laser flash method for thermal conductivity of fine ceramics. In one embodiment the bending modulus of the thermally conductive resin is preferably 300 MPa, and preferably 1 Gpa or more, at 80° C.; as measured according to ISO 178.

The thermally conductive resin is used to join the two or more heat transfer members to each other. Any thermally conductive resin having the required thermal conductivity can be used. For example, the thermally conductive resin may include a thermally conductive filler dispersed in thermoplastic resin matrix. Examples of the thermoplastic resin that can be used as a matrix include polyolefin resins such as polyethylene and polypropylene, modified polyolefin resins such as ionomer, polyamide resins (PA) such as PA6, PA66, PA11, PA12 and semi-aromatic polyamide resins, polyester resins such as polyethylene terephthalate, polybutylene terephthalate and polycyclohexylmethylene terephthalate, polyetherester copolymer, ABS resin, polycarbonate resin, modified polyphenylene ether resin, polyacetal resin, polyphenylene sulfide resin, wholly aromatic polyester resin, polyether ether ketone resin, polyether sulfone resin, polysulfone resin, polyamide-imide resin, and the like. Moreover, a copolymer obtained by combining the components configuring these resins may be used. Furthermore, these thermoplastic resins may be used independently, or a combination of two or more of them may be used. Preferably, the thermally conductive resin is selected from the group consisting of polyamide resin, polyester resin, polyphenylene sulfide resin and liquid crystalline polymer (LCP). Preferably, the thermally conductive resin includes a thermoplastic resin having a glass transition ($T_g$) temperature of 50° C. or higher, and more preferably, 80° C. or higher.

In embodiments wherein at least one of the heat transfer members is an MCPCB, or an MCPCB upon which is mounted an LED or and LED array, the thermally conductive resin preferably has a melting point of less than 220° C.; and more preferably less than 200° C. In one embodiment the at least one of the heat transfer members is an MCPCB, or an MCPCB upon which is mounted an LED or and LED array; and the thermally conductive resin is selected from the group consisting of: PA612, PA610, PA1010, PA11, PA612, polyether ester block copolymer and ionomer.

The thermal conductive filler that is dispersed within the thermoplastic resin matrix is not particularly limited. Useful thermally conductive fillers are selected from the group consisting of oxide powders, flakes and fibers composed of aluminum oxide (alumina), zinc oxide, magnesium oxide and silicon dioxide; nitride powders, flakes and fibers composed of boron nitride, aluminum nitride and silicon nitride; metal and metal alloy powders, flakes and fibers composed of gold, silver, aluminum, iron, copper, tin, tin base alloy used as lead-free solder; carbon fiber, graphite flakes or fibers; silicon carbide powder; and calcium fluoride powder; and the like. These fillers may be used independently, or a combination of two or more of them may be used.

The surface of the thermally conductive filler can be processed with a coupling agent, for the purpose of improving the interfacial bonding between the filler surface and the matrix resin. Examples of the coupling agent include silane series, titanate series, zirconate series, aluminate series, and zircoaluminate series coupling agents.

Useful coupling agents include metal hydroxides and alkoxides including those of Group IIIa thru VIIIa, Ib, IIb, IIIb, and IVb of the Periodic Table and the lanthanides. Specific coupling agents are metal hydroxides and alkoxides of metals selected from the group consisting of Ti, Zr, Mn, Fe, Co, Ni, Cu, Zn, Al, and B. Preferred metal hydroxides and alkoxides are those of Ti and Zr. Specific metal alkoxide coupling agents are titanate and zirconate orthoesters and chelates including compounds of the formula (I), (II) and (III):

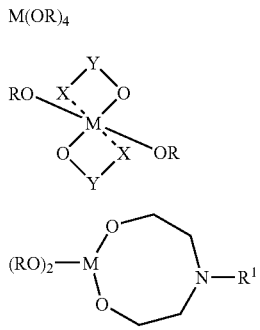

$$M(OR)_4 \quad (I)$$

(II)

(III)

wherein

M is Ti or Zr;

R is a monovalent $C_1$-$C_8$ linear or branched alkyl;

Y is a divalent radical selected from —CH(CH$_3$)—, —C(CH$_3$)=CH$_2$—, or —CH$_2$CH$_2$—;

X is selected from OH, —N(R$^1$)$_2$, —C(O)OR$^3$, —C(O)R$^3$, —CO$_2$$^-$A$^+$; wherein R$^1$ is a —CH$_3$ or C$_2$-C$_4$ linear or branched alkyl, optionally substituted with a hydroxyl or interrupted with an ether oxygen; provided that no more than one heteroatom is bonded to any one carbon atom;

R$^3$ is C$_1$-C$_4$ linear or branched alkyl;

A$^+$ is selected from NH$_4$$^+$, Li$^+$, Na$^+$, or K$^+$.

The coupling agent can be added to the filler before mixing the filler with the resin, or can be added while blending the filler with the resin. The additive amount of coupling agent is preferably 0.1 through 5 wt % or preferably 0.5 through 2 wt % with respect to the weight of the filler. Addition of coupling agent during the blending of filler with the resin has the added advantage of improving the adhesiveness between the metal used in the joint surface between the heat transfer unit or heat radiating unit and the thermally conductive resin.

If the particle diameter of the filler is too small, the viscosity of the resin may increase during blending to the extent that complete dispersion of the filler can not be accomplished. As a result, it may not be possible to obtain resin having high thermal conductivity. If the particle diameter of the filler is too large, it may become impossible to inject the thermally conductive resin into thin portions of the resin injection cavity, especially those associated with heat radiating members. Thus, the average particle diameter of the filler is preferably 0.1 through 500 µm, and more preferably 3 through 100 µm; as measured by using laser-diffraction type particle diameter distribution with a Selas Granulometer "model 920" or a laser-diffraction scattering method particle diameter distribution measuring device "LS-230" produced by Coulter K. K., for instance.

The content of the thermally conductive filler dispersed in the matrix of the thermoplastic resin is preferably in a range of 20 through 70 vol %, preferably 30 through 50 vol %, based on of the volume of the thermally conductive resin.

The thermally conductive resin can include other fillers, flame retardants, heat stabilizers, viscosity modifiers, weatherability enhancers, and other additives known in the art, according to need.

The thermally conductive resin useful in the invention can be made by methods well known in the art for dispersing fillers and other additives with thermoplastic resins such as, for example, single screw extruder, a twin screw extruder, a roll, a Banbury mixer, a Brabender, a kneader or a high shear mixer.

In one embodiment the at least one exposed surface of at least one heat transfer member has at least two surface portions; said at least two surface portions having surface planes that are at finite angles to each other.

In one embodiment the at least one exposed surface of each heat transfer member has at least two surface portions; said at least two surface portions having surface planes that are at finite angles to each other.

In another embodiment the at least one exposed surfaces of at least one heat transfer members has two surface portions; said at least two surface portions having surface planes that are parallel to each other.

Figure 4:
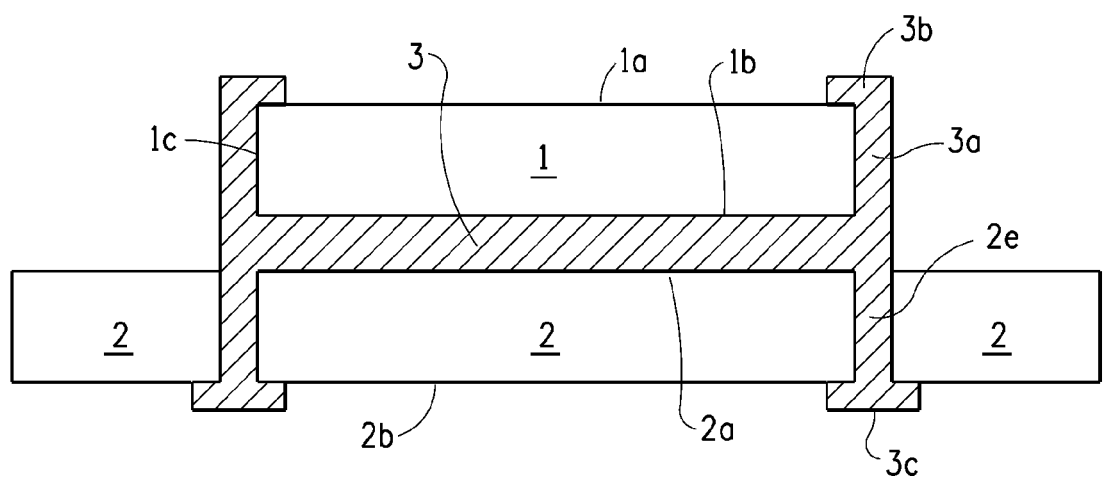

In another embodiment the at least one exposed surfaces of at least one heat transfer members is concave, convex, serrated, dimpled, interrupted to form a slit; or some combination thereof. By "slit" is meant that the exposed surface is interrupted by a channel leading to an opposing exposed surface, through which resin may flow during the injecting step. In one embodiment at least one heat transfer member has at least one exposed surface that includes one or more slits, or channels, to an opposing exposed surface. FIG. 4, as disclosed below, illustrates an integrated composite member prepared by the method of such an embodiment.

The following figures illustrate several integrated composite members provided by various embodiments of the invention.

FIG. 1 illustrates an integrated composite member prepared by the method of the invention in which a metal plate (1) has a heat-receiving surface (1a) which receives heat from an LED (not shown), a heat-radiating surface (1b) opposite to the heat-receiving surface, and a side surface (1c); a metal chassis (2) having a heat receiving surface (2a) and a heat radiating surface (2b), and a side surface (2c); the metal plate (1) and metal chassis (2) joined by a thermally conductive resin member (3), the thermally conducting resin member (3) having a side portion (3a) extending beyond the heat-radiating surface (1b) and the heat-receiving surface (2a), and a hooking portion (3b) extending beyond and over a portion of the heat-receiving surface (1a). In this case, a concave portion (1d) is provided on the heat-radiating surface (1b). The side portion (1c), and/or the heat-receiving surface (1a), optionally may have concave portions, and the hooking portion (3b) of the thermally conductive resin member may extend to a concave portion of (1a) (if present, not shown). In FIG. 1, heat receiving surface (2a), and a side surface (2c), are at right angles to one another; demonstrating integrated composite members provided by the embodiment wherein at least one exposed surface of at least one heat transfer member has at least two surface portions; said at least two surface portions having surface planes that are at finite angles to each other. Furthermore, considering surfaces (1c) and (1b) in FIG. 1, are at right angles to one another; demonstrates an integrated composite member provided by the embodiment wherein at least one exposed surface of each heat transfer member has at least two surface portions; said at least two surface portions having surface planes that are at finite angles to each other.

Figure 2:
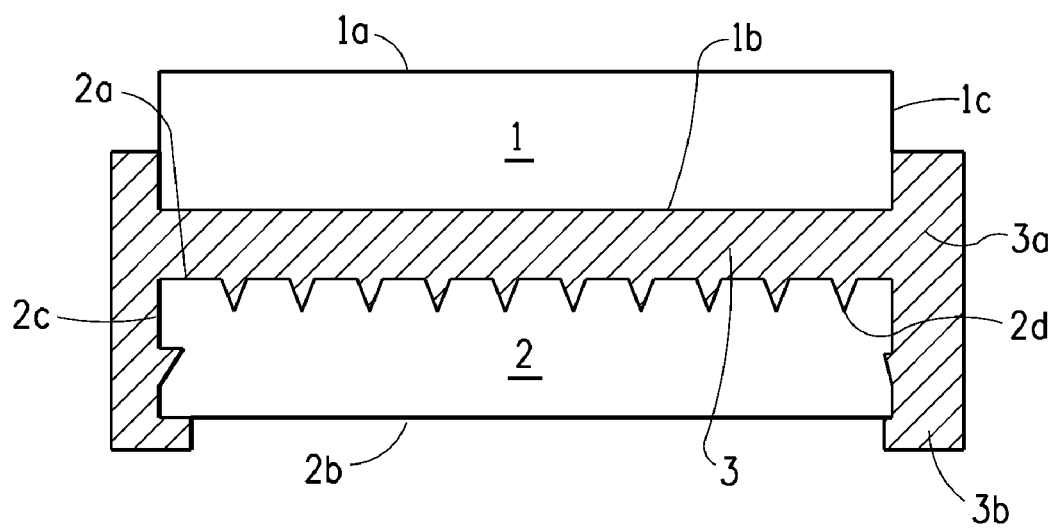

FIG. 2 illustrates an integrated composite member prepared by the method of the invention in which a metal chassis (2) has a heat-receiving surface (2a), a heat-radiating surface (2b) opposite to the heat-receiving surface, and a side surface (2c); the metal plate (1) having a heat receiving surface (1a) which receives heat from an LED (not shown), and a heat radiating surface (1b), and a side surface (1c); the metal plate (1) and metal chassis (2) joined by a thermally conductive resin member (3), the thermally conducting resin member (3) having a side portion (3a) extending beyond the heat-receiving surface (2a) and the heat-radiating surface (1b), and a hooking portion (3b) extending beyond and over a portion of the heat-radiating surface (2b). In this case, a concave portion (2d) is provided on the heat-receiving surface (2a). The side portion (2c), and/or the heat-radiating surface (2b), optionally may have concave portions, and the hooking portion (3b) of the thermally conductive resin member may extend to a concave portion of (2b) (if present, not shown). In FIG. 2, heat receiving surface (2a); and heat-radiating surface (2b), the portion thereof adjacent hooking portion (3b); demonstrate at least one exposed surface of at least one heat transfer members having two surface portions; said at least two surface portions having surface planes that are parallel to each other; as required in one embodiment of the invention.

Figure 3:
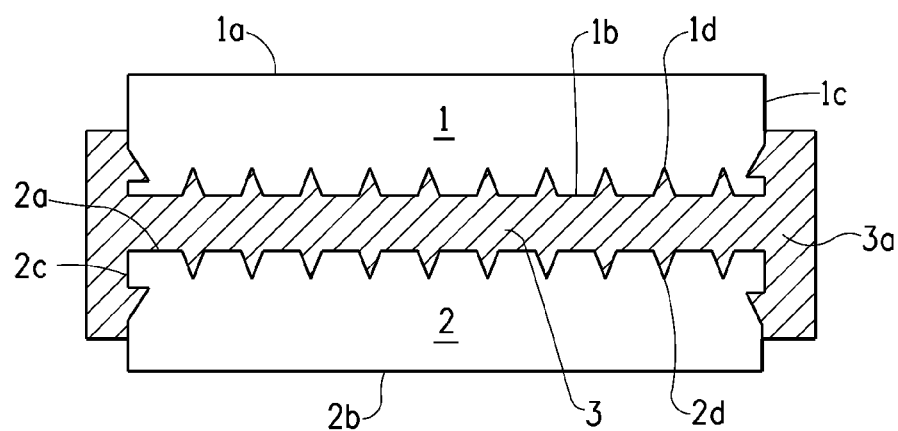

FIG. 3 illustrates an integrated composite member prepared by the method of the invention in which a metal plate (1) has a heat-receiving surface (1a) which receives heat from an LED, a heat-radiating surface (1b) opposite to the heat-receiving surface, and a side surface (1c); a metal chassis (2) having a heat receiving surface (2a) and a heat radiating surface (2b), and a side surface (2c); the metal plate (1) and metal chassis (2) joined by a thermally conductive resin member (3), the thermally conducting resin having a side portion (3a) extending beyond the heat-radiating surface (1b) and the heat-receiving surface (2a). In this case, a concave portion (1d) is provided on the heat-radiating surface (1b) and a concave portion (2d) is provided on the heat-receiving surface (2b).

FIG. 4 illustrates a modification of FIG. 1, wherein one or more portion(s) of the heat receiving surface (2a) of the metal chassis (2) form slit(s) (2e). The thermally conducting resin member (3) has a side portion (3a) extending beyond the heat-radiating surface (1b) and the heat-receiving surface (2a), and also extends through the slits (2e) providing a hooking portion (3c) over a portion of the heat-radiating surface (2b).

Figure 5:
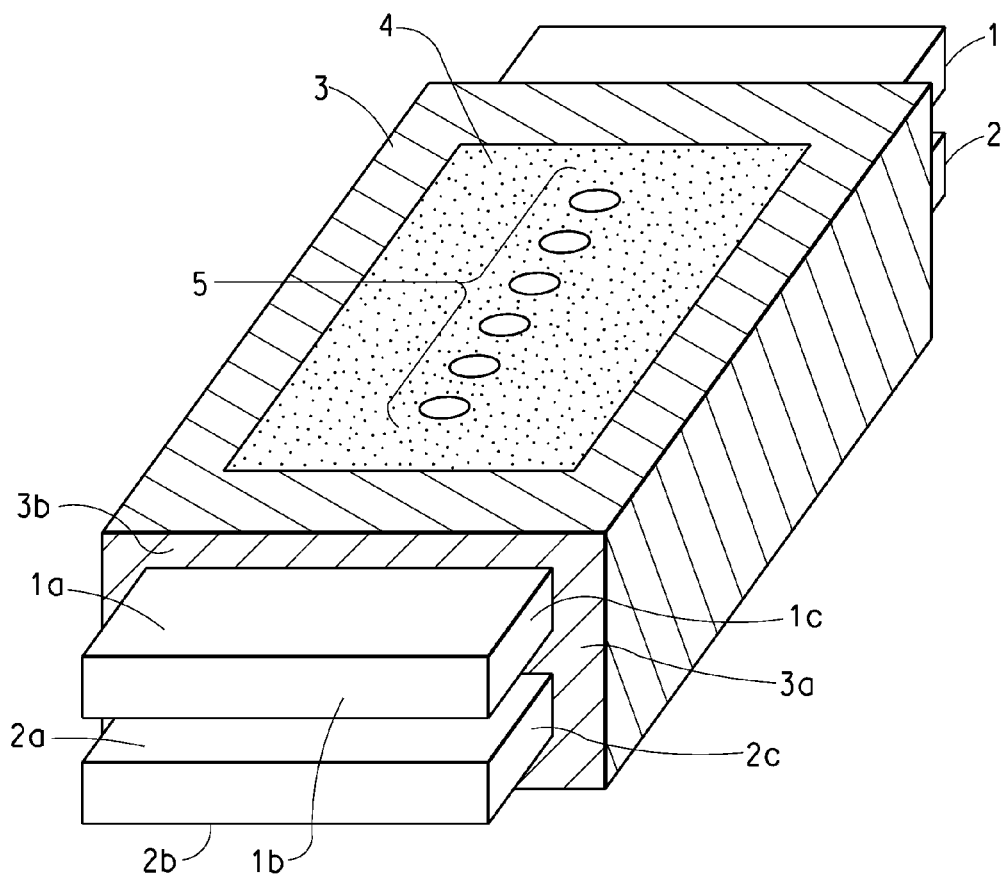
FIG. 5 illustrates an illumination device having an MCPCB comprising an LED array provided by an embodiment of the invention.

FIG. 5 illustrates a illumination device prepared by the process of the invention wherein a MCPCB (4) comprising an LED array (5) is mounted on a metal plate (1) having a heat-receiving surface (1a) which receives heat from an LED, a heat-radiating surface (1b) opposite to the heat-receiving surface, and a side surface (1c); a metal chassis (2) having a heat receiving surface (2a) and a heat radiating surface (2b), and a side surface (2c); the metal plate (1) and metal chassis (2) joined by a thermally conductive resin member (3), the thermally conducting resin having a side portion (3a) extending between the heat-receiving surface (1a) and the heat-radiating surface (1b), and a hooking portion (3b) extending beyond and over a portion of the heat-receiving surface (1a).

Figure 6:
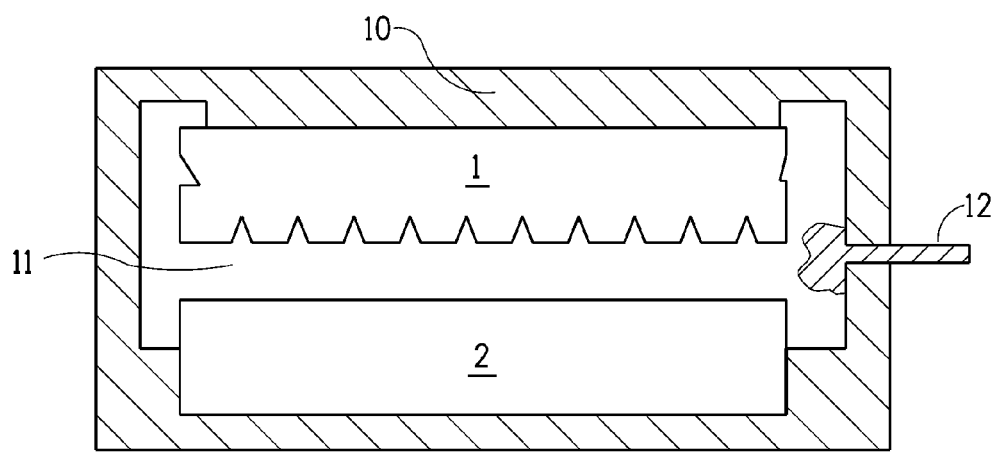
FIG. 6 illustrates injecting thermally conductive resin into the resin injection cavity.

FIG. 6 shows heat transfer members (1) and (2) that have been inserted into a mold cavity (10), and the mold closed to form the resin injection cavity (11). Thermally conductive resin (12) is injected into the resin injection cavity to contact the exposed surfaces of at least two heat transfer members.

The method of the invention can provide articles that are illumination devices; for instance wherein an LED or LED array is in thermal contact with one or more heat transfer members, for instance an MCPCB. Thus, the present invention can be used in to provide an LED backlight for a liquid crystal display (LCD), automobile lighting, decorative lighting, signs and advertisement lighting, an information display, and the like.

Another embodiment is an illumination device having a light emitting diode in thermal contact with the integrated composite member provided by the method of the invention. In this embodiment the term "in thermal contact" means that the light emitting diode is in direct contact or in contact via another element.

Materials

ZytelHTN® 501 is a polyamide 6T/66 copolymer supplied by E.I. du Pont de Nemours and Co, Wilmington, Del.

Modified-EPDM: EPDM (ethylene/propylene/diene polyolefin) grafted with 2.1 wt % maleic anhydride was purchased from Dow Chemical (Midland, Mich., USA).

m-MgO: modified magnesium oxide powder made by surface modification with 1 wt % of trimethoxy-3-aminopropoxysilane coupling agent on Coolfiller® CF2-100A magnesium oxide supplied by Tateho Chemical Industries Co., Ltd. The average size of the Coolfiller® magnesium oxide was about 25 μm.

A thermally conductive resin composition (Composition 1) listed in Table 1 was prepared using a twin screw extruder. Composition 1 was used to prepare an ISO specimen having a thickness of 4 mm by injection molding. The bending modulus was measured by the method according to ISO 178 and is listed in Table 1.

The thermal conductivity of Composition 1 was measured by the laser flash method (JIS R1611).

TABLE 1

| Thermally conductive resin - composition 1 | |
|---|---|
| ZytelHTN ® 501 (wt. %) | 28.5 |
| Modified-EPDM (wt. %) | 1.5 |
| m-MgO (wt. %) | 70 |
| Thermal Conductivity (W/mK) | 1.1 |
| Bending Modulus (GPa) | 9.5 |

Example 1

Two aluminum plates, each having a thickness of 1 mm, were inserted into a mold of an injection molding machine in such a manner that a resin injection cavity having a gap between the plates of about 2 mm was formed. The thermally conductive resin composition 1 was injected into the injection resin cavity to provide an integrated composite member of aluminum/thermally conductive resin.

A MCPCB circuit board of an LED was placed on one of the aluminum plates of the composite member, and an aluminum block heat sink was attached to the other aluminum plate via a thermally conductive sheet. A constant power output (12 V) was applied to the LED, and the thermal resistance ($\psi Jt$) was obtained using the following equation when the surface temperature of the LED (Tc) and the surface temperature of the heat sink (Tj) became constant:

$$\psi Jt = (Tj - Tc)/\text{Power Consumption (° C./W)}$$

The measured thermal resistance was 0.3° C./W.

Comparative Example 1

An integrated composite member of aluminum/thermally conductive resin was prepared in the same manner as Example 1, except that 35% glass-fiber-reinforced polyamide (Zytel® HTN 51G35L supplied by E.I. du Pont de Nemours and Co.) having a thermal conductivity of 0.3 W/m·K was used in the injecting step. The thermal resistance of the composite member, obtained in the same manner as Example 1, was 0.8° C./W.

This demonstrates that the thermal conductivity of the resin is an important attribute in determining the thermal resistivity of the composite member. Resins having higher thermal conductivity generally provide composite members having lower thermal resistance.

Comparative Example 2

Two aluminum plates were fixed by a screw via a thermally conductive sheet having a thickness of 1 mm and a thermal conductivity of 2.5 W/m·K (manufactured by Shin-Etsu Chemical Co., Ltd., TC-100THS) to provide a composite article. The thermal resistance of the article, measured in the same manner as Example 1, was 0.3° C./W.

As shown in the experiment described above, by using the present invention, the illumination device with excellent radiation properties can be produced without using a screw or the like device.

The invention claimed is:

1. A method for integrating at least two heat transfer members to provide an integrated composite member, the method comprising:
   a) disposing the at least two heat transfer members in a mold cavity, such that said heat transfer members each have at least one exposed surface forming a surface of a resin injection cavity; and
   b) injecting a thermally conductive resin into the resin injection cavity to contact the exposed surfaces of the at least two heat transfer members, to form the integrated composite member;
wherein the thermally conductive resin has a thermal conductivity of at least 0.7 W/mK or higher; the heat transfer members have a thermal conductivity of at least 10 W/mK and are selected from the group consisting of a metal core printed circuit board; metallic pipes, plates, blocks, frames, chassis, and housings; graphite sheets; thermally conductive composite pipes, plate, blocks, frames, chassis, and housings; and any combination thereof, and wherein the at least one exposed surface of at least one heat transfer member has at least two surface portions; said at least two surface portions having surface planes that are at finite angles to each other or said at least two surface portions having surface planes that are parallel to each other.

2. The method of claim 1 wherein the thermally conductive resin has a bending modulus of 300 MPa or higher at 80° C.

3. A method for integrating at least two heat transfer members to provide an integrated composite member, the method comprising:
   a) disposing the at least two heat transfer members in a mold cavity, such that said heat transfer members each have at least one exposed surface forming a surface of a resin injection cavity, wherein at least one of the at least two heat transfer members in the mold cavity is a metal core printed circuit board upon which is mounted an LED or and LED array; and
   b) injecting a thermally conductive resin into the resin injection cavity to contact the exposed surfaces of the at least two heat transfer members, to form the integrated composite member;
wherein the thermally conductive resin has a thermal conductivity of at least 0.7 W/mK or higher; the heat transfer members have a thermal conductivity of at least 10 W/mK, and wherein the at least one exposed surface of at least one heat transfer member has at least two surface portions; said at least two surface portions having surface planes that are at finite angles to each other or said at least two surface portions having surface planes that are parallel to each other.

4. The method of claim 3, wherein the thermally conductive resin has a bending modulus of 300 MPa or higher at 80° C.

5. A method for integrating at least two heat transfer members to provide an integrated composite member, the method comprising:
   a) disposing the at least two heat transfer members in a mold cavity, such that said heat transfer members each have at least one exposed surface forming a surface of a resin injection cavity, wherein the at least one exposed surface of at least one heat transfer members is concave, convex, serrated, dimpled, interrupted to form a slit, or a combination thereof; and
   b) injecting a thermally conductive resin into the resin injection cavity to contact the exposed surfaces of the at least two heat transfer members, to form the integrated composite member;
wherein the thermally conductive resin has a thermal conductivity of at least 0.7 W/mK or higher; the heat transfer members have a thermal conductivity of at least 10 W/mK, and wherein the at least one exposed surface of at least one heat transfer member has at least two surface portions; said at least two surface portions having surface planes that are at finite angles to each other or said at least two surface portions having surface planes that are parallel to each other.

6. The method of claim 5, wherein the thermally conductive resin has a bending modulus of 300 MPa or higher at 80° C.

\* \* \* \* \*